(12) United States Patent
Yum (10) Patent No.: US 9,718,100 B2
(45) Date of Patent: Aug. 1, 2017

(54) SPRAY UNIT AND APPARATUS FOR CLEANING SUBSTRATE HAVING SPRAY UNIT

(71) Applicant: SAMSUNG DISPLAY CO., LTD., Yongin-si, Gyeonggi-Do (KR)

(72) Inventor: Je-Yung Yum, Asan-si (KR)

(73) Assignee: Samsung Display Co., Ltd., Yongin-Si, Gyeonggi-do (KR)

( * ) Notice: Subject to any disclaimer, the term of this patent is extended or adjusted under 35 U.S.C. 154(b) by 0 days.

(21) Appl. No.: 14/849,724

(22) Filed: Sep. 10, 2015

(65) Prior Publication Data

US 2016/0207074 A1 Jul. 21, 2016

(30) Foreign Application Priority Data

Jan. 15, 2015 (KR) .................... 10-2015-0007621

(51) Int. Cl.
*A47L 15/42* (2006.01)
*B05B 1/04* (2006.01)
*B05B 1/18* (2006.01)
*B05B 7/04* (2006.01)
*B05B 7/08* (2006.01)
*B08B 3/02* (2006.01)
*B08B 3/04* (2006.01)
*H01L 21/67* (2006.01)
*H01L 51/00* (2006.01)

(52) U.S. Cl.
CPC .......... *B08B 3/022* (2013.01); *A47L 15/4278* (2013.01); *B05B 1/044* (2013.01); *B05B 1/18* (2013.01); *B05B 7/0425* (2013.01); *B05B 7/0846* (2013.01); *B08B 3/041* (2013.01); *H01L 21/67051* (2013.01); *H01L 51/0004* (2013.01)

(58) Field of Classification Search
CPC ....... A47L 15/4278; B05B 1/044; B05B 1/18; B05B 7/0425; B05B 7/0846; B08B 3/022; B08B 3/041; H01L 21/67051
USPC .......... 134/95.2, 151, 198; 239/419.5, 428.5, 239/543
See application file for complete search history.

(56) References Cited

U.S. PATENT DOCUMENTS 4,962,891 A * 10/1990 Layden .................. B05B 1/044
134/198
2013/0306116 A1* 11/2013 Imai .................. H01L 21/67034
134/95.2

FOREIGN PATENT DOCUMENTS

| JP | 2008-030019 A | 2/2008 |
| KR | 10-2005-0019298 A | 3/2005 |
| KR | 10-2008-0101466 A | 11/2008 |
| KR | 10-1347634 B1 | 1/2014 |

* cited by examiner

*Primary Examiner* — Michael Barr
*Assistant Examiner* — Levon J Shahinian
(74) *Attorney, Agent, or Firm* — Lee & Morse, P.C.

(57) ABSTRACT

A spray unit, including a body assembly including a solution supply port, the solution port to supply cleaning solution; a flow channel in the body assembly, the flow channel connected with the solution supply port, the cleaning solution to flow through the flow channel; and a spray slit connected to the flow channel, the spray slit to spray out the cleaning solution, the flow channel including at least two chambers to hold the cleaning solution and at least two internal slits connecting the chambers to each other.

10 Claims, 6 Drawing Sheets

SPRAY UNIT AND APPARATUS FOR CLEANING SUBSTRATE HAVING SPRAY UNIT

CROSS-REFERENCE TO RELATED APPLICATION

Korean Patent Application No. 10-2015-0007621, filed on Jan. 15, 2015, in the Korean Intellectual Property Office, and entitled: "Spray Unit and Apparatus For Cleaning Substrate Having Spray Unit," is incorporated by reference herein in its entirety.

BACKGROUND

1. Field

The described technology relates to a spray unit and an apparatus for cleaning a substrate.

2. Description of the Related Art

In the processes of manufacturing a flat panel display (FPD), such as an organic light emitting diode (OLED) display or an liquid crystal display (LCD), particles and foreign substances on substrates or films may be removed in advance to prevent reduced quality, the adherence of a thin film to be deposited may be increased, and cleaning for improving properties of the FPD may be performed.

SUMMARY

Embodiments may be realized by providing a spray unit, including a body assembly including a solution supply port, the solution port to supply cleaning solution; a flow channel in the body assembly, the flow channel connected with the solution supply port, the cleaning solution to flow through the flow channel; and a spray slit connected to the flow channel, the spray slit to spray out the cleaning solution, the flow channel including at least two chambers to hold the cleaning solution and at least two internal slits connecting the chambers to each other.

The body assembly may include a first body including the solution supply port; and a second body combined with the first body so that the flow channel and the spray slit are therebetween.

The flow channel may be in the first body or the second body.

The flow channel may be in the first body.

The flow channel may be connected to the solution supply port through a connection channel.

The flow channel may include a first chamber connected with the solution supply port; at least two internal slits each including a first end connected to the first chamber and through which the cleaning solution in the first chamber flows; and a second chamber connected to a second end of the internal slits and to the spray slit.

The spray unit may further include a third chamber in the spray slit.

The spray slit may include a connection slit connecting the third chamber with the second chamber; and a discharge slit connected with the third chamber, the discharge slit to spray out the cleaning solution.

The connection slit and the discharge slit may have a same cross-sectional area.

Each internal slit may include a first slit connecting the first chamber with the second chamber; and a second slit spaced from the first slit and connecting the first chamber with the second chamber.

The internal slits and the spray slit may have different cross-sectional areas.

Each internal slit may have a smaller cross-sectional area than a cross-sectional area of the discharge slit.

The cross-sectional area of each internal slit may be 75% or less of the cross-sectional area of the discharge slit.

An apparatus for cleaning a substrate may include a frame to hold the spray unit; and a conveyer at a side of the frame, the conveyer including a plurality of rollers to convey a substrate.

The apparatus may further include a dryer at a side of the conveyer, the dryer to blow dry air onto the substrate.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of features may be exaggerated for clarity of illustration. Like reference numerals refer to like elements throughout.

Figure 1:
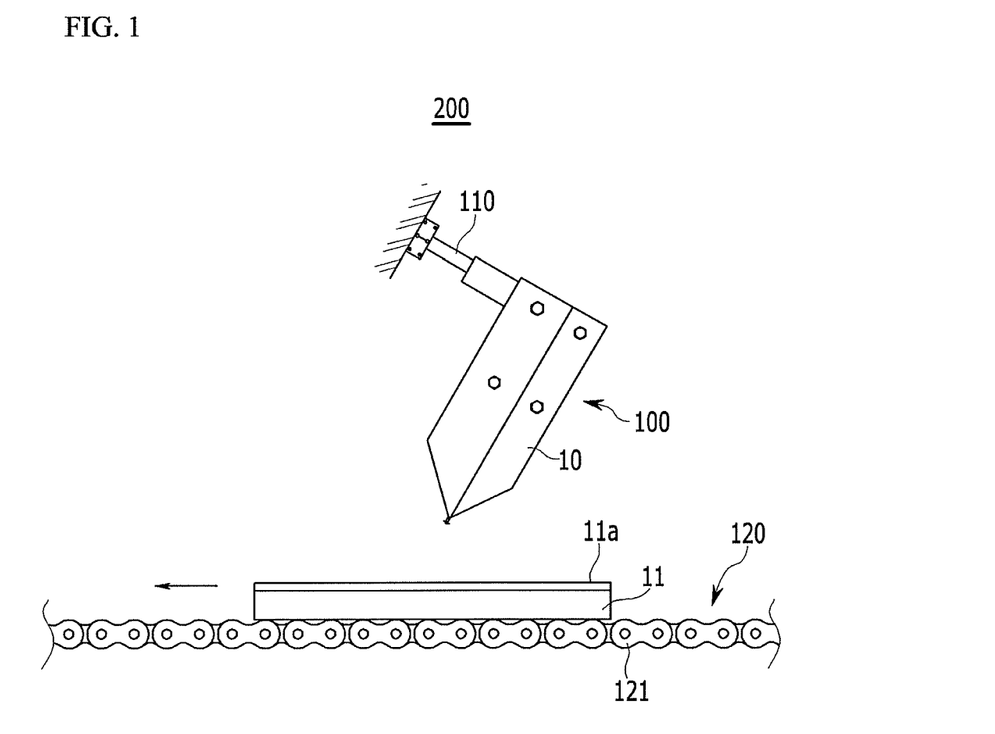
FIG. 1 illustrates a schematic side view of an apparatus for cleaning a substrate which is equipped with a spray unit according to a first exemplary embodiment.

FIG. 1 illustrates a schematic side view of an apparatus for cleaning a substrate which is equipped with a spray unit according to a first exemplary embodiment.

As illustrated in FIG. 1, an apparatus 200 for cleaning a substrate using a spray unit according to a first exemplary embodiment may include a frame 110 holding a spray unit 100 and a conveyer 120 disposed at a side of the frame 110 and conveying a substrate 11.

The frame 110, which is provided for holding the spray unit 100, may be disposed at a side of the conveyer 120. Although the spray unit 100 may be held by the frame 110 at a side of the conveyer 120 in the exemplary embodiment, it may be formed integrally with the conveyer 120.

The conveyer 120 may include a plurality of rollers 121 arranged with predetermined intervals. The rollers 121, which are provided for conveying the substrate forward, may be made of rubber with friction to smoothly convey the substrate 11.

The substrate 11, as described above, may be moved forward by the conveyer 120, and in this process, the foreign substances on the substrate 11 may be removed by the spray unit 100.

Chemical foreign substances 11a may remain on the substrate 11. A silicon layer such as an amorphous silicon layer or a polysilicon layer may be on the substrate 11 and a silicon oxide film may be on the silicon layer. The silicon oxide film, which may be an oxide film formed on the silicon layer in a manufacturing process, may be removed by the spray unit 100 of the exemplary embodiment. In an embodiment, the object to be removed by the spray unit 100 may be predetermined foreign substances on the substrate 11.

Figure 2:
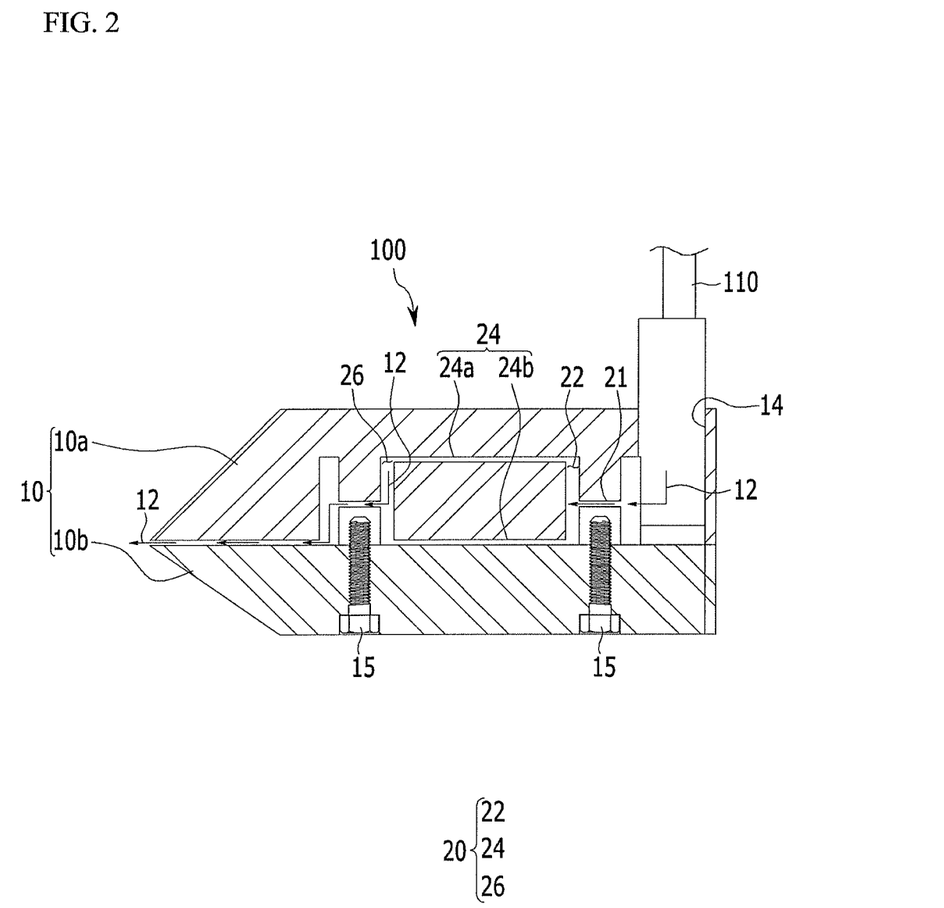
FIG. 2 illustrates a schematic cross-sectional view of the spray unit of FIG. 1.

FIG. 2 illustrates a schematic cross-sectional view of the spray unit of FIG. 1.

As illustrated in FIG. 2, the spray unit 100 may include a body assembly 10 having a solution supply port 14 for supplying cleaning solution 12, a flow channel 20 formed in the body 10 and connected to the solution supply port 14 for cleaning solution to flow through it, and a spray slit 30 connected to the flow channel 20 and spraying out cleaning solution.

The body assembly 10 of the spray unit 100 may include a first body 10a and a second body 10b combined with the first body 10a.

The first body 10a, which may be a part of the body assembly 10, may have the solution support port 14 at a side, and the cleaning solution 12 may be injected into the first body 10a through the solution supply port 14.

The second body 10b, which may constitute the body assembly 10 of the spray unit 100 in cooperation with the first body 10a, may be fixed to a side of the first body 10a by fasteners such as a bolt. The flow channel 20 and the spray slit 30 through which the cleaning solution 12 flows may be formed between the second body 10b and the first body 10a.

Figure 3:
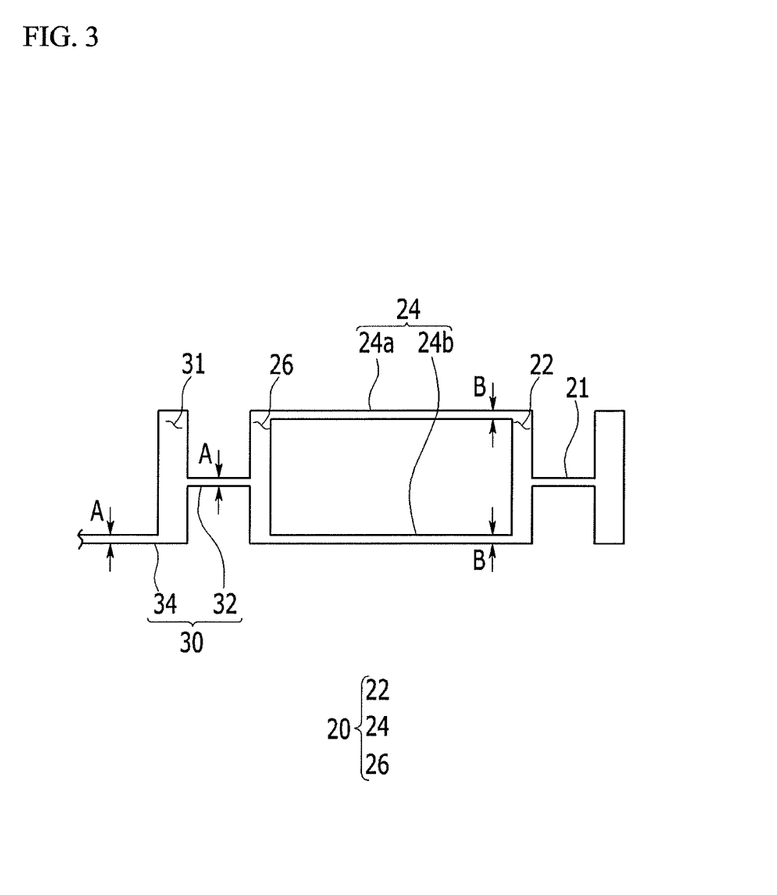
FIG. 3 illustrates a schematic view of a flow channel and an internal slit of the spray unit of FIG. 2.

FIG. 3 illustrates a schematic view of a flow channel and an internal slit of the spray unit of FIG. 2.

As illustrated in FIG. 3, the flow channel 20 may be connected to the solution supply port 14 through a connection channel 21, and the cleaning solution supplied into the solution supply port 14 may be supplied to the flow channel 20 through the connection channel 21. In the exemplary embodiment, the flow channel 20, which may be formed in the first body 10a, may have a plurality of chambers for temporarily keeping the cleaning solution 12.

The flow channel 20 may include a first chamber 22 that may be first filled with the cleaning solution 12, an internal slit 24 connected to the first chamber 22, and a second chamber 26 connected to the internal slit 24.

The first chamber 22 may be connected with the solution supply port 14 and may be primarily filled with the cleaning solution 12, as the cleaning solution 12 coming out of the solution supply port 14 keeps flowing. The first chamber 22 may be connected to the solution supply port 14 through the connection channel 21, and a buffer space may be secured while the cleaning solution 12 is discharged. A shock may be applied to the spray unit 100, and the cleaning solution 12 in the first chamber 22 may receive a minimum influence of the shock and may maintain a predetermined pressure. The first chamber 22 may be connected with the internal slit 24.

The internal slit 24 may have a first end connected to the first chamber 22 and a second end connected to the second chamber 26. The internal slit 24 may be formed to enable the cleaning solution 12 to smoothly flow from the first chamber 22 to the second chamber 26. By forming a plurality of internal slits 24, even if there are foreign substances in any one of them, the cleaning solution 12 may smoothly flow through another slit. This will be described in detail below.

The internal slit 24 may include a first slit 24a connecting the first chamber 22 with the second chamber 26 and a second slit 24b spaced from the first slit 24a and connecting the first chamber 22 with the second chamber 26.

The first slit 24a may have a first end connected to an edge of the first chamber 22 and a second end connected to an edge of the second chamber 26. In the exemplary embodiment, the first slit 24a, which may be formed in the first body 10a, may have a cross-sectional area B smaller than a discharge cross-sectional area A of the spray slit 30.

As described above, the cross-sectional area B of the first slit 24a may be made smaller than the discharge cross-sectional area A of the spray slit 30, and remaining foreign substances in the first slit 24a may be filtered, when cleaning solution 12 includes foreign substances. As described above, when foreign substances in cleaning solution 12 are filtered by the first slit 24a, the cleaning solution 12 may flow to the second chamber 26 through the second slit 24b.

The second slit 24b spaced from the first slit 24a may have a first end connected to an edge of the first chamber 22 and a second end connected to an edge of the second chamber 26. The second slit 24b may have the same size and length as the first slit 24a, and the second slit 24b may provide a channel for cleaning solution 12 in the first chamber 22 to flow to the second chamber 26.

The second slit 24b, which may be formed in the first body 10a, may have a cross-sectional area smaller than a discharge cross-sectional area of the spray slit 30, and, as described above, foreign substances in cleaning solution 12 may be filtered. When foreign substances in cleaning solution 12 are filtered, the cleaning solution 12 may flow to the second chamber 26 through the first slit 24a.

As described above, the internal slit 24 may connect the first chamber 22 with the second chamber 26 by means of the first slit 24a and the second slit 24b. The cross-sectional area of the internal slit 24 may be made smaller than the discharge cross-sectional area of the spray slit 30.

In the exemplary embodiment, the internal slit 24 may have a cross-sectional area that is 75% or less of the discharge cross-sectional area of the spray slit 30, and foreign substances in cleaning solution 12 may be stuck and filtered by any one of the first slit 24a and the second slit 24b while passing through the internal slit 24.

Figure 4:
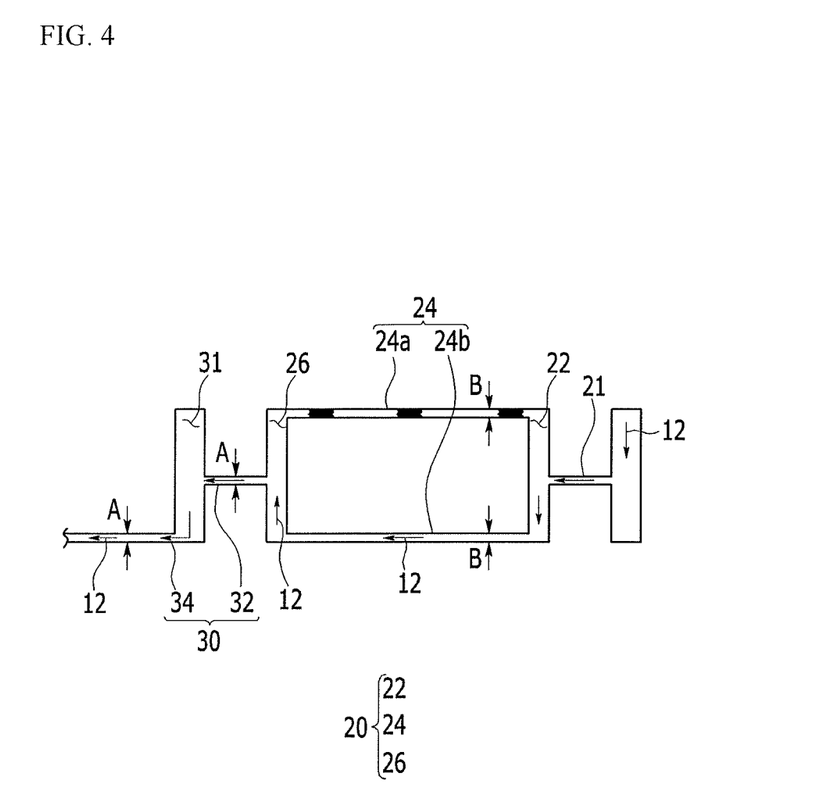
FIG. 4 illustrates a schematic view of foreign substances in cleaning solution filtered by a first slit of the internal slit of FIG. 3.
Figure 5:
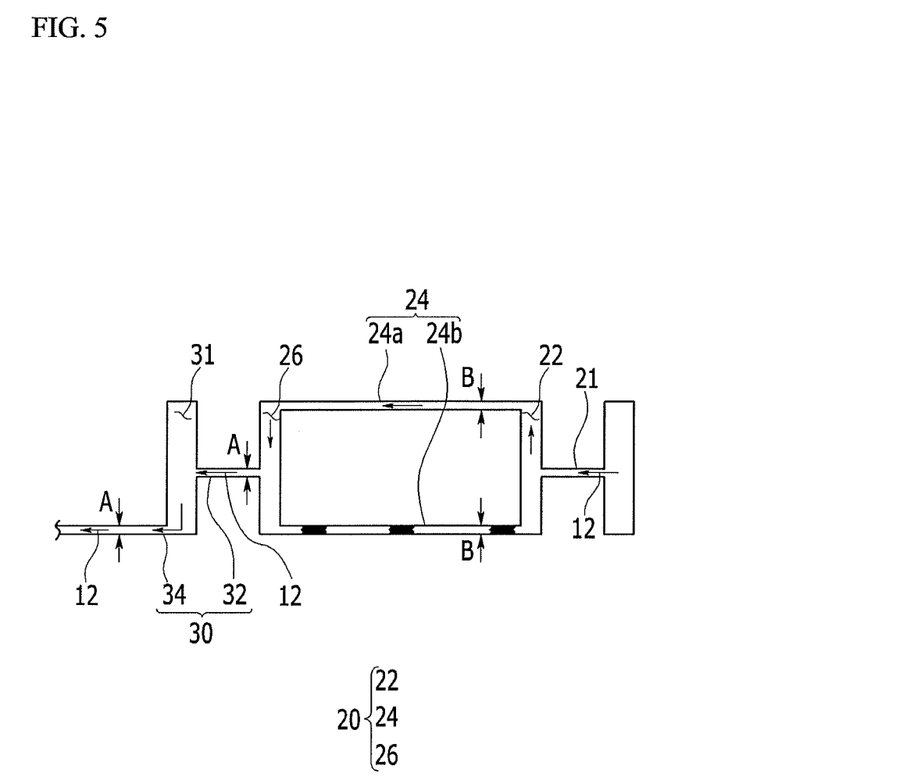
FIG. 5 illustrates a schematic view of foreign substances in cleaning solution filtered by a second slit of the internal slit of FIG. 3.

FIG. 4 illustrates a schematic view of foreign substances in cleaning solution filtered by the first slit of the internal slit of FIG. 3, and FIG. 5 illustrates a schematic view of foreign substances in cleaning solution filtered by the second slit of the internal slit of FIG. 3.

As illustrated in FIGS. 4 and 5, when cleaning solution 12 includes a foreign substance, the cleaning solution 12 may be supplied to the spray slit 30 after being filtered by any one of the first slit 24a and the second slit 24b, and the cleaning solution 12 may be sprayed without a foreign substance.

In the exemplary embodiment, the cross-sectional area of the internal slit 24 may be 75% or less of the cross-sectional area of the spray slit 30. In an embodiment, the cross-sectional area of the internal slit 24 may have any size smaller than the cross-sectional area of the spray slit 30.

The cleaning solution 12 filtered through the internal slit 24, as described above, may be sprayed onto the substrate 11 through the spray slit 30, and cleaning may be performed.

The spray slit 30, which may be a part receiving cleaning solution 12 from the second chamber 26 and then spraying it to the substrate 11, may have a third chamber 31, and the cleaning solution 12 may be sprayed well.

The spray slit 30 may have the third chamber 31, and a sudden drop of pressure, for example, due to an external shock while cleaning solution 12 is sprayed, may be prevented, and an appropriate amount of cleaning solution 12 may be sprayed. Accordingly, it may be possible to prevent stains from remaining on the substrate 11 in the process of cleaning.

The spray slit 30 may include a connection slit 32 connecting the third chamber 31 with the second chamber 26 and a discharge slit 34 connected with the third chamber 31 to spray cleaning solution 12 to the substrate 11.

The connection slit 32 may have a first end connected to the second chamber 26 and a second end connected to the third chamber 31, and the cleaning solution 12 in the second chamber 26 may flow into the third chamber 31. The connection slit 32 may be shorter than the internal slit 24 and cleaning solution 12 may flow through it.

The discharge slit 34 may have one end connected to the third chamber 31 and a second end opened to the outside of the body assembly 10, and cleaning solution 12 may be sprayed out of the spray unit 100. The discharge slit 34 may have the same cross-sectional area as the connection slit 32 and cleaning solution 12 may be discharged through it.

As described above, the spray unit 100 of the exemplary embodiment may spray cleaning solution 12 with foreign substances filtered through the internal slit 24, in addition to absorbing a shock with the chambers in the process of spraying the cleaning solution 12. Accordingly, the cleaning solution 12 may be sprayed at a constant pressure from the spray unit 100, and the cleaning solution 12 may be stably sprayed without splitting into several streams. Therefore, the work of cleaning the substrate may be performed more smoothly, and the efficiency of cleaning the substrate 11 and the quality may be improved.

The operation of the exemplary embodiment having this configuration is described hereafter in more detail.

Figure 6:
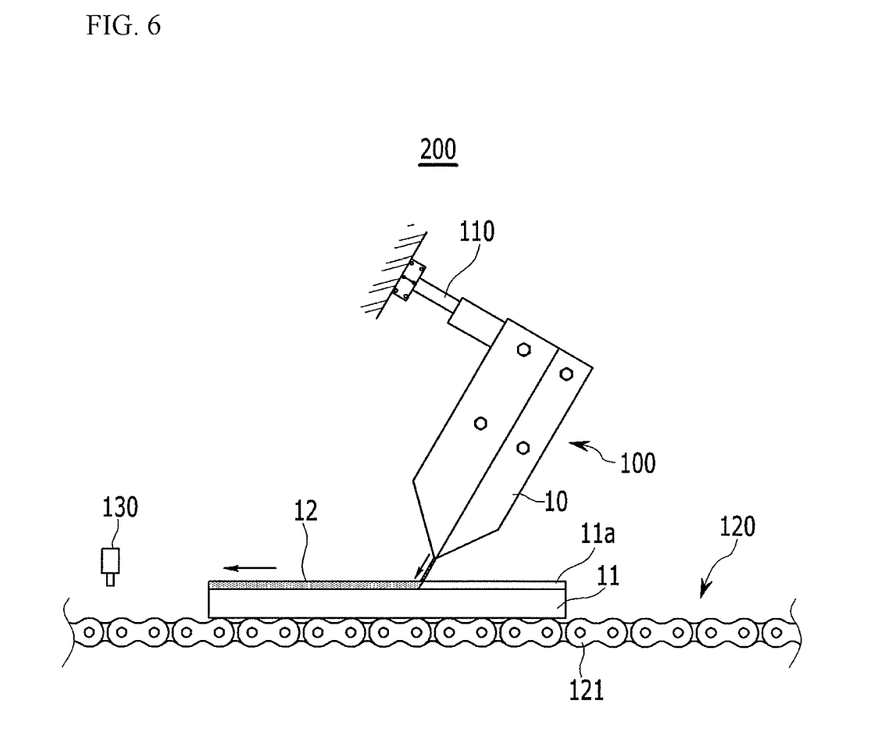
FIG. 6 illustrates a schematic side view of the apparatus for cleaning a substrate in FIG. 1 which is in operation for cleaning a substrate by spraying cleaning solution through the spray unit.

First, the substrate 11 may be moved by the conveyer 120.

Next, as illustrated in FIG. 6, the spray unit 100 may spray cleaning solution 12 to, e.g., onto, the substrate 11 moving on the conveyer 120.

When there is a foreign substance in the cleaning solution 12, the foreign substance may be filtered through the internal slit 24 in the spray unit 100. The cleaning solution 12 may pass through the plurality of chambers while being sprayed from the spray unit 100, and even if an external shock is applied, a sudden pressure drop may be prevented and the shock may be absorbed, and the cleaning solution 12 may be stably sprayed.

The substrate 11 may be dried by a dryer 130, when the cleaning is finished.

By way of summation and review, a cleaner for cleaning in a process of manufacturing an FPD may be used in main processes such as depositing, etching, developing, and stripping. For example, a cleaner may include an aqua knife that sprays cleaning solution or process solution such as pure water, deionized (DI) water, or etching solution.

In such a cleaner, a flow channel through which cleaning solution flows in the cleaner and a spray slit through which the cleaning solution is discharged may be the same size, and foreign substances in the cleaning solution may stick to the spray slit. Therefore, the cleaning solution may not be sprayed well from the cleaner, and may be split, for example, due to foreign substances, and stains may remain on a substrate.

Embodiments relate to a spray unit that may improve efficiency and quality of cleaning.

Provided are a spray unit that may improve quality, for example, by not leaving stains, in cleaning and an apparatus for cleaning a substrate using the spray unit.

According to an exemplary embodiment, a shock may be absorbed by a plurality of chambers while cleaning solution is sprayed, and the cleaning solution may be sprayed with a foreign substance filtered therefrom. Accordingly, the cleaning solution may be sprayed at a predetermined temperature from the spray unit and stably sprayed without splitting into several streams.

According to an exemplary embodiment, the work of cleaning a substrate may be more smoothly performed, and the efficiency of the work of cleaning a substrate and the quality may be improved.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A spray unit, comprising:
a body assembly including a solution supply port, the solution supply port to supply cleaning solution, a first body including the solution supply port, and a second body combined with the first body such that a flow channel and a spray slit are therebetween, wherein:
the flow channel in the body assembly between the first body and the second body, is connected with the solution supply port, the cleaning solution to flow through the flow channel; and
the spray slit between the first body and the second body is connected to the flow channel, the spray slit to spray out the cleaning solution, and
the flow channel includes at least two chambers to hold the cleaning solution and at least two filters between the chambers, the filters being in a form of internal slits connecting the chambers to each other, a height of the internal slits being less than a height of the spray slit, the height of the internal slits and the height of the spray slit being in a combining direction of the first body and the second body.

2. The spray unit as claimed in claim 1, wherein the flow channel is in the first body or the second body.

3. The spray unit as claimed in claim 2, wherein the flow channel is in the first body.

4. The spray unit as claimed in claim 1, wherein the flow channel is connected to the solution supply port through a connection channel.

5. The spray unit as claimed in claim 1, wherein the flow channel includes:
a first chamber of the at least two chambers, the first chamber being connected with the solution supply port;

the at least two internal slits each include a first end connected to the first chamber through which the cleaning solution in the first chamber flows; and a second chamber of the at least two chambers, the second chamber being connected to a second end of the internal slits and to the spray slit.

6. The spray unit as claimed in claim 5, further comprising:

a third chamber in the spray slit downstream from the second chamber;

a connection slit connecting the third chamber with the second chamber; and a discharge slit connected with the third chamber, the discharge slit to spray out the cleaning solution.

7. The spray unit as claimed in claim 1, wherein each internal slit includes:

a first slit connecting a first chamber of the at least two chambers with a second chamber of the at least two chambers; and a second slit spaced from the first slit and connecting the first chamber with the second chamber.

8. An apparatus for cleaning a substrate, comprising:

the spray unit as claimed in claim 1;

a frame holding the spray unit; and a conveyer at a side of the frame, the conveyer including a plurality of rollers to convey the substrate.

9. The apparatus as claimed in claim 8, further comprising a dryer at a side of the conveyer, the dryer to blow dry air onto the substrate.

10. A spray unit, comprising:

a body assembly including a solution supply port, the solution supply port to supply cleaning solution;

a flow channel in the body assembly, the flow channel connected with the solution supply port, the cleaning solution to flow through the flow channel; and a spray slit connected to the flow channel, the spray slit to spray out the cleaning solution, the flow channel including:

a first chamber connected with the solution supply port;

at least two internal slits each including a first end connected to the first chamber and through which the cleaning solution in the first chamber flows; and a second chamber connected to a second end of the internal slits and to the spray slit, and the spray slit including:

a third chamber located downstream from the second chamber, a connection slit connecting the third chamber with the second chamber, and a discharge slit connected with the third chamber, the discharge slit connecting the third chamber to an outside to spray out the cleaning solution.

* * * * *